US008742812B2

(12) United States Patent  (10) Patent No.: US 8,742,812 B2
Kim  (45) Date of Patent: Jun. 3, 2014

(54) PIPE LATCH CIRCUIT AND DRIVING METHOD THEREOF

(75) Inventor: Jae-Il Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1073 days.

(21) Appl. No.: 12/344,634

(22) Filed: Dec. 29, 2008

(65) Prior Publication Data

US 2010/0142308 A1 Jun. 10, 2010

(30) Foreign Application Priority Data

Dec. 4, 2008 (KR) ................... 10-2008-0122534

(51) Int. Cl.
*H03K 3/356* (2006.01)
*H03K 3/012* (2006.01)
(52) U.S. Cl.
CPC ..................... *H03K 3/012* (2013.01)
USPC ....................................... 327/208
(58) Field of Classification Search
USPC ........... 327/99, 199, 208, 214, 225, 210–212, 327/407–410
See application file for complete search history.

(56) References Cited

U.S. PATENT DOCUMENTS

| | | | | |
|---|---|---|---|---|
| 5,625,303 A * | 4/1997 | Jamshidi | ................... | 326/106 |
| 6,956,399 B1 * | 10/2005 | Bauer | ................... | 326/41 |
| 7,259,587 B1 * | 8/2007 | Schmit et al. | ................... | 326/41 |
| 7,385,859 B2 * | 6/2008 | Nam | ................... | 365/194 |
| 7,434,082 B2 * | 10/2008 | Parikh | ................... | 713/501 |
| 2007/0200605 A1 * | 8/2007 | Marsh et al. | ................... | 327/208 |

FOREIGN PATENT DOCUMENTS

| | | |
|---|---|---|
| KR | 1020000044572 | 7/2000 |
| KR | 1020040013532 | 2/2004 |

OTHER PUBLICATIONS

Notice of Preliminary Rejection issued from Korean Intellectual Property Office on May 27, 2010.

* cited by examiner

*Primary Examiner* — Sibin Chen
(74) *Attorney, Agent, or Firm* — IP & T Group LLP

(57) ABSTRACT

A pipe latch circuit includes a pipe input unit configured to receive a plurality of data in an order corresponding to address information, a control signal generator configured to generate first and second control clock signals by using the address information, where the first and second control clock signals correspond to a synchronization clock signal, and a pipe output unit configured to synchronize an output signal of the pipe input unit with the first and second control clock signals and output the synchronized output signal.

25 Claims, 9 Drawing Sheets

US 8,742,812 B2

PIPE LATCH CIRCUIT AND DRIVING METHOD THEREOF

CROSS-REFERENCE(S) TO RELATED APPLICATIONS

The present invention claims priority of Korean patent application number 10-2008-0122534, filed on Dec. 4, 2008, which is incorporated by reference in its entirety.

BACKGROUND OF THE INVENTION

The present invention relates to a semiconductor design technology, and more particularly, to a pipe latch circuit for serializing a plurality of data in a predetermined order to output the serialized data, and a driving method thereof.

A semiconductor memory device such as Double Data Rate Synchronous DRAM (DDR SDRAM) has been advanced for achieving high speed data processing and large storage capacity. A conventional semiconductor memory device such as a Single Data Rate Synchronous DRAM (SDR SDRAM) outputs a plurality of data by synchronizing the data with a rising edge of an external clock signal. However, the semiconductor memory device such as a DDR SDRAM outputs a plurality of data by synchronizing the data not only with a rising edge but also with a falling edge of an external clock signal. That is, the DDR SDRAM can process data twice as much as the SDR SDRAM at the same frequency of the external signal.

Meanwhile, a semiconductor memory device includes a pipe latch circuit for effectively processing data. The pipe latch circuit latches a plurality of data stored in memory cells in the semiconductor memory device, receives data in an order corresponding to the address information, and outputs data in response to a synchronization clock signal. Here, latching a plurality of data is referred as pre-fetch. For example, 2-bit pre-fetch means that two data are latched by one read command. 4-bit pre-fetch means that four data are latched by one read command. The latched data are inputted in a predetermined order corresponding to address information and outputted after being synchronized with a synchronization clock signal. The pipe latch circuit enables the semiconductor memory device to process a large amount of data at a high speed through the above described operation of the pipe latch circuit.

Meanwhile, the semiconductor memory device includes about ten million memory cells for storing data. The semiconductor memory device stores or outputs data according to a command from a central processing unit CPU. That is, the semiconductor memory device stores data at a memory cell corresponding to an address inputted from the CPU when the CPU requests a write operation. Also, the semiconductor memory device outputs data stored in a memory cell corresponding to an address inputted from the CPU when the CPU requests a read operation. In the write operation, data inputted through an input/output pad is inputted to a memory cell through a data input path. In the read operation, data stored in a memory cell is outputted to an external device through the input/output pad after passing through a data output path.

The semiconductor memory device receives a read command that is synchronized with an external clock signal in the read operation and outputs data synchronized with an internal clock signal to the outside. That is, the semiconductor memory device uses the internal clock signal to output data instead of using the external clock signal. Therefore, the semiconductor memory device must generate an internal command by synchronizing the read command synchronized with the external clock signal with the internal clock signal in the read operation. Here, synchronizing a signal, which is synchronized with one clock, with the other clock, like the read command, is referred as domain crossing.

The semiconductor memory device includes a plurality of circuits for performing the domain crossing operation, and a domain crossing performed signal corresponding to a read command is referred as an "output enable signal". The output enable signal is synchronized with an internal clock signal and includes CAS latency information. Here, the CAS latency includes information on time duration from a time of applying a read command to a time of outputting corresponding data in a unit time of one cycle of an external clock signal. The semiconductor memory device employs the output enable signal to output data synchronized to an external clock signal at a target time after the read command.

A skew between an external clock signal and an internal clock signal may be generated by delay components in the semiconductor memory device. In order to correct the skew, the semiconductor memory device includes an internal clock signal generating circuit. The internal clock signal generating circuit includes a phase locked loop and a delay clock loop (DLL). In the specification, a DLL clock signal generated from the delay lock loop (DLL) will be used as the internal clock signal. The DLL clock signal is used as a reference for synchronizing data in the semiconductor memory device.

FIGS. 1A and 1B are circuit diagrams illustrating a part of a conventional pipe latch circuit. The conventional pipe latch circuit may include a rising pipe latch unit 110R corresponding to a rising edge of a DLL clock signal, shown in FIG. 1A, and a falling pipe latch unit 110F corresponding to a falling edge of a DLL clock signal, shown in FIG. 1B.

Referring to FIG. 1A, the rising pipe latch unit 110R receives zeroth to seventh data MXOUT<0:7> in an order corresponding to address information and outputs a rising output signal RDOB in response to a rising output control signal RPOUT. The rising pipe latch unit 110R includes a rising pipe input unit 111R, a first rising selection output unit 113R, a second rising selection output unit 115R and a rising output unit 117R.

The rising pipe input unit 111R outputs corresponding data of the zeroth to seventh data MXOUT<0:7> to zeroth to third rising nodes NR0, NR1, NR2 and NR3 in response to even control signals START_EV and START_EVB and odd control signals START_OD and START_ODB. Each control signal controlling the rising pipe input unit 111R will be described later with reference to FIG. 2.

The first rising selection output unit 113R outputs data applied to corresponding node among the zeroth to third rising nodes NR0, NR1, NR2, and NR3 to fourth and fifth rising nodes NR4 and NR5 in response to a first rising order selection signal SOSESR1R_B. The second rising selection output unit 115R outputs data applied to the fourth and fifth rising nodes NR4 and NR5 in response to a second rising order selection signal SOSEB2R_B.

The first and second rising order selection signals SOSEB1R_B and SOSEB2R_B controlling the first and second rising selection output units 113R and 115R will be described again with reference to FIG. 2.

The rising output unit 117R outputs an output signal of the second rising selection output unit 115R as the rising output signal RDOB in response to the rising output control signal RPOUT. The rising output control signal RPOUT will be described again with reference to FIG. 2.

Referring to FIG. 1B, the falling pipe latch unit 110F receives zeroth to seventh data MXOUT<0:7> in an order corresponding to address information and outputs a falling output signal FDOB in response to a falling output control signal FPOUT. The falling pipe latch unit 110F includes a falling pipe input unit 111F, a first falling selection output unit 113F, a second falling selection output unit 115F and a falling output unit 117F.

The falling pipe input unit 111F outputs corresponding data among zeroth to seventh data MXOUT<0:7> to zeroth to third falling nodes NF0, NF1, NF2, and NF3 in response to even control signals START_EV and START_EVB and odd control signals START_OD and START_ODB. Each control signal for controlling the falling pipe input unit 111F will be described again with reference to FIG. 2.

The first falling selection output unit 113F outputs data applied to a corresponding node among the zeroth to third falling nodes NF0, NF1, NF2, and NF3 to fourth and fifth falling nodes NF4 and NF5 in response to a first falling order selection signal SOSEB1F_B. The second falling selection output unit 115F outputs data applied to the fourth or fifth falling nodes NF4 and NF5 in response to the second falling order selection signal SOSEB2F_B. The first and second falling order selection signals SOSEB1F_B and SOSEB2F_B for controlling the first and second falling selection output units 113F and 115F will be described again with reference to FIG. 2.

The falling output unit 117F outputs an output signal of the second falling selection output unit 115F as the falling output signal FDOB in response to the falling output control signal FPOUT. The falling output control signal FPOUT will be described again with reference to FIG. 2.

FIG. 2 is a circuit diagram illustrating a control signal generator for generating signals that controls a rising pipe latch unit 110R and a falling pipe latch unit 110F shown in FIGS. 1A and 1B.

As shown, the control signal generator includes an odd/even control signal generator 210, a rising control signal generator 230R and a falling control signal generator 230F.

The odd/even control signal generator 210 generates even control signals START_EV and START_EVB and odd control signals START_OD and START_ODB in response to a pipe enable signal PINB and a zeroth order deciding signal SOSEB<0>.

The pipe enable signal PINB is activated in response to a time point of delaying as long as an asynchronous time a control signal for controlling applying data stored in a memory cell to a global data line. The control signal controls the data to be applied to the global data line after the data stored in the memory cell is transferred from a bit line to a local data line. Then, the zeroth order deciding signal SOSEB<0> is a signal corresponding to a zeroth address applied in a read operation. Finally, the odd/even control signal generator 210 is enabled in response to the pipe enable signal PINB and activates the even control signals START_EV and START_EVB or the odd control signals START_OD and START_ODB according to the zeroth order deciding signal SOSEB<0>.

The rising control signal generator 230R generates the first and second rising order selection signals SOSEB1R_B and SOSEB2R_B in response to first and second rising order deciding signals SOSEB_R<1> and SOSEB_R<2>) and the rising output control signal RPOUT. The rising output control signal RPOUT is a signal for controlling an output period of the rising pipe latch unit 110R (see FIG. 1). The first and second rising order deciding signals SOSEB_R<1> and SOSEB_R<2> are signals for toggling according to first and second addresses applied in a read operation. Finally, the rising control signal generator 230R is enabled in response to the rising output control signal RPOUT and outputs the first and second rising order selection signals SOSEB1R_B and SOSEB2R_B in response to the first and second rising order deciding signal SOSEB_R<1> and SOSEB_R<2> as shown in FIG. 3.

The falling control signal generator 230F generates the first and second falling order selection signals in response to the falling output control signal FPOUT and first and second falling order deciding signals SOSEB_F<1> and SOSEB_F<2>. Here, the falling output control signal FPOUT is a signal controlling an output period of the falling pipe latch unit 110F (See FIG. 1). The first and second falling order deciding signals SOSEB_F<1> and SOSEB_F<2> are signals for toggling according to first and second addresses applied in the read operation. Finally, the falling control signal generator 230F is enabled in response to the falling output control signal FPOUT and outputs the first and second falling order selection signals SOSEB1F_B and SOSEB2F_B in response to the first and second falling order deciding signals SOSEB_F<1> and SOSEB_F<2> as shown in FIG. 3.

FIG. 3 illustrates waveforms of signals in a read operation, shown in FIGS. 1A, 1B and 2. For illustration purposes, it may be assumed that the zeroth to second addresses are applied as '000'. If the zeroth to second addresses are applied as '000', pre-fetched zeroth to seventh data MXOUT<0:7> are outputted through an input/output pad DQ in an order of the zeroth data XMOUT<0>→the first data XMOUT<1>→the second data XMOUT<2>→the third data XMOUT<3>→the fourth data XMOUT<4>→the fifth data XMOUT<5>→the sixth data XMOUT<6>→the seventh data XMOUT<7>.

Here, FIGS. 1A, 1B, 2 and 3 illustrate circuits and timing diagrams of a semiconductor memory device supporting an 8-bit pre-fetch operation. The pipe latch circuit decides an output order of the zeroth to seventh data MXOUT<0:7> using a zeroth order deciding signal SOSEB<0> corresponding to a zeroth address, first rising and falling order deciding signals SOSEB_R<1> and SOSEB_F<1> corresponding to a first address, and second rising and falling order deciding signals SOSEB_R<2> and SOSEB_F<2> corresponding to a second address. In other words, the pipe latch circuit pre-fetches eight data, the zeroth to seventh data MXOUT<0:7> and sequentially outputs the pre-fetched eight data corresponding to three addresses. For example, in case of a semiconductor memory device supporting a 4-bit pre-fetch operation, the pipe latch circuit pre-fetches four data and sequentially outputs the pre-fetched data corresponding to two addresses.

The semiconductor memory device starts outputting data at a time corresponding to CAS latency CL after a read command RD. Here, the zeroth to seventh data XMOUT<0:7> are outputted to the input/output pad DQ in response to a rising clock signal RCLKDO corresponding to a rising edge of a DLL clock signal CLK_DLL and a falling clock signal FCLKDO corresponding a falling edge of the DLL clock signal CLK_DLL. The rising clock signal RCLKDO and the falling clock signal FCLKDO are generated based on an output enable signal and a DLL clock signal CLK_DLL corresponding to the rising edge and the falling edge of the DLL clock signal CLK_DLL.

Hereinafter, operation of a semiconductor memory device will be described with reference to FIGS. 1A, 1B, 2 and 3.

In response to the read command RD, the pipe enable signal PINB is activated to logic 'low' level. Here, since the zeroth order deciding signal SOSEB<0> is 0, the even control signal START_EV is activated to logic 'high' level, and the even control signal bar START_EVB is activated to logic 'low' level.

Therefore, the rising pipe input unit 111R outputs the zeroth data MXOUT<0> to the zeroth rising node NR0, outputs the second data MXOUT<2> to the first rising node NR1, outputs the fourth data MXOUT<4> to the second rising node NR2, and outputs the sixth data MXOUT<6> to the third rising node NR3.

Meanwhile, the rising output control signal RPOUT and the falling output control signal FPOUT are activated to logic 'high' level in response to a DLL clock signal CLK_DLL corresponding to the CAS latency CL. Here, the rising output control signal RPOUT is activated in response to a falling edge of the DLL clock signal CLK_DLL which is ahead of the CAS latency by a half clock. The falling output control signal is activated in response to a rising edge of the DLL clock signal CLK_DLL corresponding to the CAS latency CL. The rising output control signal RPOUT and the falling output control signal FPOUT are inactivated after four tCKs in consideration that a burst length is 8. For example, if a burst length is 4, the rising output control signal RPOUT and the falling output control signal FPOUT are inactivated after 2tCK.

The rising control signal generator 230R outputs the first and second rising order selection signals SOSEB1R_B and SOSEB2R_B according to the first and second rising order deciding signals SOSEB_R<1> and SOSEB_R<2>. That is, the first rising order selection signal SOSEB1R_B is synchronized with a falling edge of a DLL clock signal CLK_DLL which is ahead of the CAS latency CL by a half clock in an activation period of the rising output control signal RPOUT and is toggled in 1tCK-by-1tCK basis. The second rising order selection signal SOSEB2R_B is synchronized with a falling edge of the DLL clock signal that the rising order selection signal SOSEB1R_B is synchronized with in an activation period of the rising output control signal RPOUT and is toggled in 2 tCK-by-2 tCK basis. As shown, the first and second rising order selection signals SOSEB1R_B and SOSEB2R_B have sequentially have values of (1,1)→(0,1) →(1,0)→(0,0) in 1tCK-by-1tCK basis. For reference, the toggling times of the first and second rising order selection signals SOSEB1R_B and SOSER2R_B are decided by the first and second addresses.

Hereinafter, when the first and second rising order selection signals SOSEB1R_Band SOSEB2R_B have a value of (1,1), the related operation of a pipe latch circuit will be described.

The first rising selection output unit 113R outputs the zeroth data MXOUT<0> applied to the zeroth rising node NR0 to the fourth rising node NR4 and outputs the fourth data XMOUT<4> applied to the second rising node NR2 to the fifth rising node NR5. The second rising selection output unit 115R outputs the zeroth data MXOUT<0> applied to the fourth rising node NR4. Finally, the rising output unit 117R outputs the zeroth data MXOUT<0> as the rising output signal RDOB.

When the first and second rising order selection signals SOSEB1R_B and SOSEB2R_B have a value of (0,1), the second data MXOUT<2> is outputted as the rising output signal RDOB through corresponding operation to the first and second rising order selection signals SOSEB1R_B and SOSEB2R_B. When the first and second rising order selection signals SOSEB1R_B and SOSEB2R_B have a value of (1,0), the fourth data MXOUT<4> is outputted as the rising output signal RDOB. When the first and second rising order selection signals SOSEB1R_B and SOSEB2R_B have a value of (0,0), the sixth data MXOUT<6> is outputted as the rising output signal RDOB. That is, the rising output signal RDOB transits to the zeroth data MXOOUT<0>→the second data MXOOUT<2>→the fourth data MXOOUT<4>→the sixth data MXOOUT<6>.

The falling pipe latch unit 110F performs the similar operation of the rising pipe latch unit 110R in response to output signals of the odd/even control signal generator 210 and the falling control signal generator 230F. The falling output signal FDOB transits to the first data MXOUT<1>→the third data MXOUT<3>→the fifth data MXOUT<5>→the seventh data MXOUT<7>. If operating times of the rising pipe latch unit 110R and the falling pipe latch unit 110F are considered, the input/output pad DQ sequentially outputs data in order of the zeroth data XMOUT<0>→the first data XMOUT<1>→the second data XMOUT<2>→the third data XMOUT<3>→the fourth data XMOUT<4>→the fifth data XMOUT<5>→the sixth data XMOUT<6>→the seventh data XMOUT<7>.

Meanwhile, semiconductor memory devices have been advanced for high data processing, and an operating frequency of the semiconductor memory device has been increasing. The high operation frequency may cause problems that were not generated in a semiconductor memory device having a comparatively low operation frequency. As an example of the problems, a data margin problem of data that is synchronized with a clock signal corresponding to the operation frequency has been receiving attention.

Referring to FIGS. 1 and 3 again, four control signals are used to output the rising output signal RDOB in the rising pipe latch unit 110R. That is, the rising pipe input unit 111R is controlled by the even control signals START_EV and START_EVB, and odd control signals START_OD and START_ODB. The first rising selection output unit 113R is controlled by the first rising selection signal SOSEB1R_B, the second rising selection output unit 115R is controlled by the second rising selection signal SOSEB2R_B, and the rising output unit 117R is controlled by the rising output control signal RPOUT.

Since the even control signals START_EV and START_EVB and the odd control signals START_OD are START_ODB are activated in response to the pipe enable signal PINB, the even control signals START_EV and START_EVB and the odd control signals START_OD and START_ODB are activated before a time of outputting a plurality of data. A problem occurs by a control signal of the first rising selection output unit 113R, the second rising selection output unit 115R and the rising output unit 117R.

More specifically, the first and second rising order selection signals SOSEB1R_B and SOSEB2R_B are synchronized with the DLL clock signal CLK_DLL in an activation period of the rising output control signal RPOUT as shown in FIG. 2. Therefore, when the rising output unit 117R is enabled in response to the rising output control signal RPOUT, the first and second rising selection output units 113R and 115R, which are controlled by the first and second order selection signals SOSEB1R_B and SOSEB2R_B, are enabled, and data are transferred in a corresponding order. Therefore, the rising output signal RDOB outputted from the rising output unit 117R may output garbage data while transferring data through the first and second rising selection output units 113R and 115R.

Such a problem similarly occurs when the falling pipe latch unit 110F outputs the falling output signal FDOB, and reduces a valid data window of the rising output signal RDOB and the falling output signal FDOB. The valid data window may be further reduced by a skew generated according to a process, a voltage and a temperature. Finally, the valid data window of data outputted as the rising output signal RDOB and the falling output signal FDOB of the pipe latch circuit become smaller. That is, a margin of the rising clock signal RCLKDO and the falling clock signal FCLKDO shown in FIG. 2 becomes smaller. Finally, such a margin problem may cause an error that makes the semiconductor memory device to inaccurately output data.

SUMMARY OF THE INVENTION

Exemplary embodiments of the present invention are directed to providing a pipe latch circuit for minimizing the number of control signals synchronized with a synchronization clock signal to sequentially output a plurality of data in a predetermined order.

Exemplary embodiments of the present invention are directed to providing a pipe latch circuit for reflecting information on an order for outputting a plurality of data to a control signal that controls a data outputting operation of the pipe latch circuit.

In accordance with an aspect of the present invention, there is provided a pipe latch circuit, which includes a pipe input unit configured to receive a plurality of data in an order corresponding to address information, a control signal generator configured to generate first and second control clock signals by using the address information, where the first and second control clock signal correspond to a synchronization clock signal, and a pipe output unit configured to synchronize an output signal of the pipe input unit with the first and second control clock signals and output the synchronized output signal.

In accordance with still another aspect of the present invention, there is provided a method of driving a pipe latch circuit, including receiving a plurality of data in an order corresponding to at least one part of address information, generating a plurality of control clock signals by reflecting a remaining part of the address information to a synchronization clock signal, and outputting the plurality of data sequentially in response to the plurality of control clock signals.

In accordance with still another aspect of the present invention, there is provided a pipe latch circuit, which includes a first pipe input unit, responsive to a first edge of a synchronization clock signal, configured to sequentially receive a plurality of data in an order corresponding to address information, a second pipe input unit, responsive to a second edge of the synchronization clock signal, configured to sequentially receive the plurality of data in an order corresponding to the address information, a control signal generator configured to generate a plurality of first and second control clock signals by using the address information to the synchronization clock signal, a first pipe output unit configured to output an output signal of the first pipe input unit in synchronization with the plurality of first control clock signals, and a second pipe output unit configured to output an output signal of the second pipe input unit in synchronization with the plurality of second control clock signals.

A pipe latch circuit and a driving method thereof according to embodiments of the present invention minimize the number of control signals responding a synchronization signal among the control signals in the pipe latch circuit. Therefore, a skew generated while the data is transferred can be minimized. Particularly, the skew can be minimized and a valid data window can be maximized by using information for deciding an output order of a plurality of data to a clock signal for controlling the final outputting of the pipe latch circuit. Furthermore, data with a stable valid data window can improve a margin with a control signal of an output driver for driving an input/output pad.

DESCRIPTION OF SPECIFIC EMBODIMENTS

Other objects and advantages of the present invention can be understood by the following description, and become apparent with reference to the embodiments of the present invention.

Figure 4A:
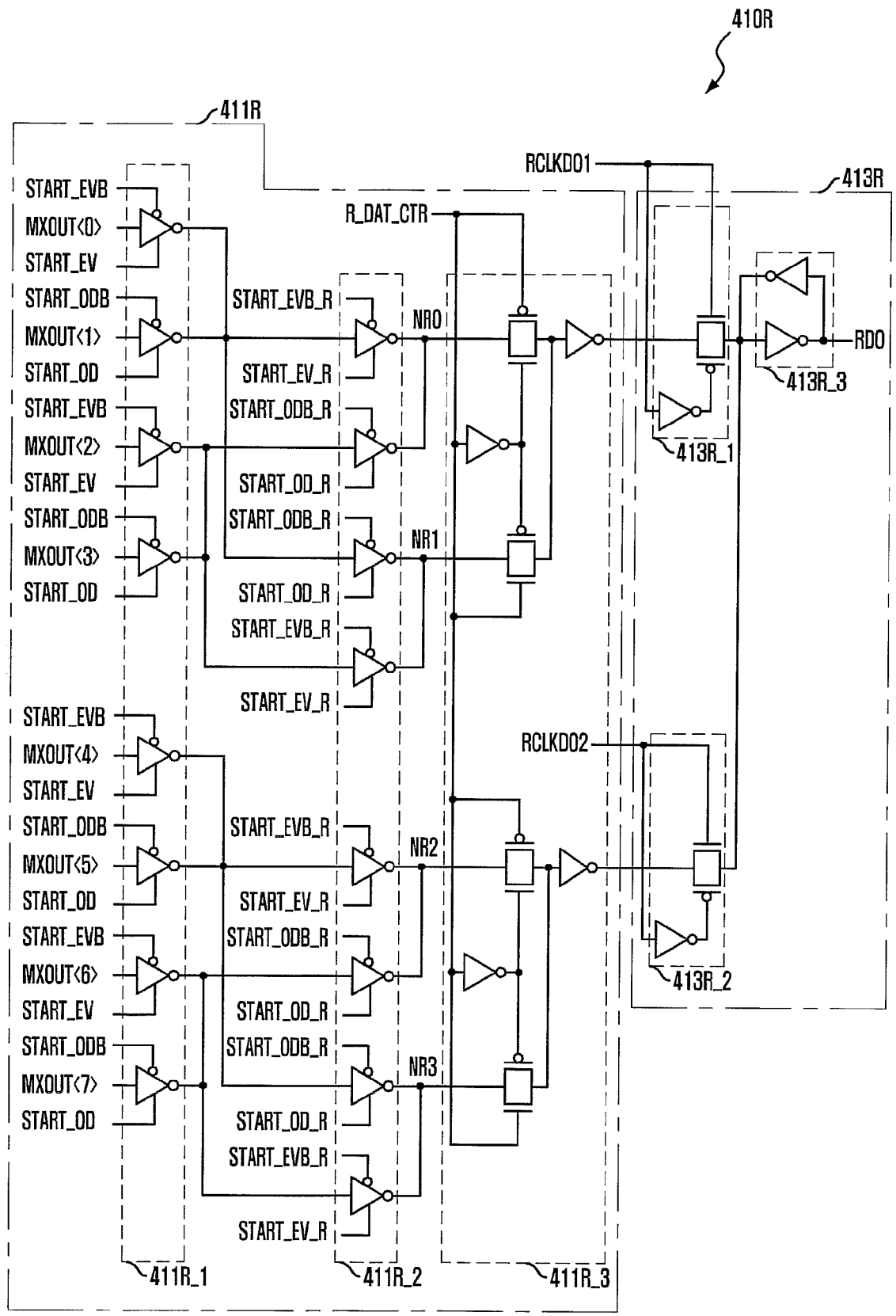
FIGS. 4A and 4B are circuit diagrams illustrating a part of a pipe latch circuit in accordance with an embodiment of the present invention.
Figure 4B:
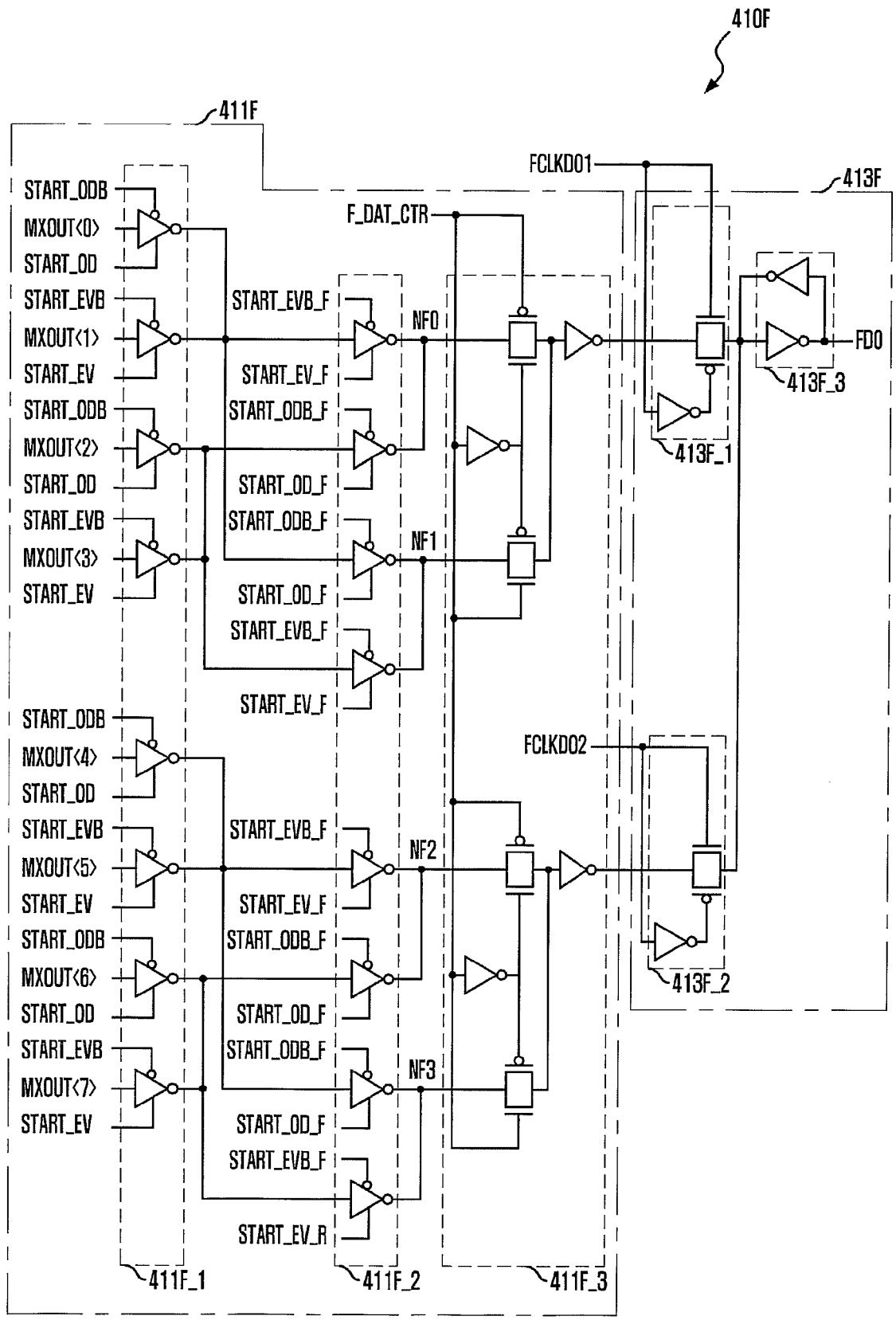

FIGS. 4A and 4B are circuit diagrams illustrating a part of a pipe latch circuit in accordance with an embodiment of the present invention.

The pipe latch circuit according to the present embodiment includes a rising pipe latch unit 410R corresponding to a rising edge of a DLL clock signal, which is shown in FIG. 4A, and a falling pipe latch unit 410F corresponding to a falling edge of a DLL clock signal, which is shown in FIG. 4B.

Referring to FIG. 4A, the rising pipe latch unit 410R receives zeroth to seventh data MXOUT<0:7> and outputs a rising output signal RDO in an order corresponding to address information in response to first and second rising clock signals RCLKDO1 and RCLKDO2. The rising pipe latch unit 410 includes a rising pipe input unit 411R and a rising pipe output unit 413R. Here, the first and second rising clock signals RCLKDO1 and RCLKOD2 may be generated based on with address information and correspond to the rising edge of the DLL clock signal which is a synchronization clock signal.

The rising pipe input unit 411R receives corresponding data among the zeroth to seventh data MXOUT<0:7> in response to even and odd control signals START_EV, START_EVB, START_OD and START_ODB, rising even and odd control signals START_EV_R, START_EVB_R, START_OD_R and START_ODB_R, and a rising data control signal R_DAT_CTR and outputs the received data to zeroth to third rising nodes NR0, NR1, NR2, and NR3. The rising pipe input unit 441R includes a first path selector 411R_1, a second path selector 411R_2 and a selection output unit 411R_3.

Here, the first path selector 411R_1 selects an output path of corresponding data among the zeroth to seventh data MXOUT<0:7> in response to the even and odd control signals START_EV, START_EVB, START_OD and START_ODB. The second path selector 441R_2 selects an output path of an output signal of the first path selector 441R_1 in response to the rising even and odd control signals START_

EV_R, START_EVB_R, START_OD_R and START_ODB_R. Therefore, the zeroth to seventh data MXOUT<0:7> are outputted to corresponding rising nodes among the zeroth to third rising nodes NR0, NR1, NR2, and NR3 by the first and second path selectors 441R_1 and 441R_2.

The selection output unit 411R_3 selectively outputs an output signal of the second path selector 411R_2 in response to a rising data control signal R_DAT_CTR. That is, data applied to the zeroth rising node NR0 and the second rising node NR2 is outputted or data applied to the first rising node NR1 and the third rising node NR2 is outputted according to the data control signal R_DAT_CTR.

Here, the rising pipe input unit 411R according to the present embodiment is controlled by the even and odd control signals START_EV, START_EVB, START_OD and START_ODB, and the rising even and odd control signals START_EV_R, START_EVB_R, START_OD_R and START_ODB_R, and the rising data control signal R_DAT_CTR. These control signals will be described again with reference to FIG. 5. The rising pipe input unit 411R may transfer corresponding data among the zeroth to seventh data MXOUT<0:7> to the zeroth to third rising nodes NR0, NR1, NR2 and NR3 according to one part of address information corresponding to an output order of the zeroth to seventh data MXOUT<0:7>.

The rising pipe output unit 413R synchronizes an output signal of the rising pipe input unit 411R with first and second rising clock signals RCLKDO1 and RCLKDO2 and outputs the synchronized signal as a rising output signal RDO. The rising pipe output unit 413R includes a first synchronizer 413R_1, a second synchronizer 413R_2 and a latch unit 413R_3.

The first synchronizer 413R_1 synchronizes one of the output signals from the rising pipe input unit 411R corresponding to a logic 'low' period of a rising data control signal R_DAT_CTR with a first rising clock signal RCLKDO1 and outputs the synchronized signal. The second synchronizer 413R_2 synchronizes one of output signals from the rising pipe input unit 441R corresponding to a logic 'high' period of a rising data control signal R_DAT_CTR with a second rising clock signal RCLKDO2. The latch unit 413R_2 latches the output signals of the first and second synchronizers 413R_1 and 413R_2 and outputs the latched signal as a rising output signal RDO.

The first and second rising clock signals RCLKDO1 and RCLKDO2 will be described again with reference to FIG. 5. The rising pipe output unit 413R according to the present embodiment is controlled by the first and second rising clock signals RCLKDO1 and RCLKDO2. The rising pipe output unit 413R according to the present embodiment outputs corresponding data among the data applied to the zeroth to third rising nodes NR0, NR1, NR2 and NR3 in response to remaining part of address information corresponding to the output order of the zeroth to seventh data MXOUT<0:7>.

Referring to FIG. 4B, the falling pipe latch unit 410F receives the zeroth to seventh data MXOUT<0:7> and outputs a falling output signal FDOB in an order of address information in response to first and second falling clock signals FCLKDO1 and FCLKDO2. The falling pipe latch unit 410F includes a falling pipe input unit 411F and a falling pipe output unit 413F. Here, the first and second falling clock signals FCLKDO1 and FCLKDO2 are reflected with address information and correspond to a falling edge of a DLL clock signal which is a synchronization signal. Since the falling pipe latch unit 410F has a structure similar to that of the rising pipe latch unit 410R, detail description thereof is omitted.

Here, the falling pipe input unit 411F receives corresponding data among the zeroth to seventh data MXOUT<0:7> in response to even and odd control signals START_EV, START_EVB, START_OD and START_ODB, falling even and odd control signals START_EV_F, START_EVB_F, START_OD_F and START_ODB_F, and a falling data control signal F_DAT_CTR and outputs the received data to the zeroth to third falling nodes NF0, NF1, NF2 and NF3. The even and odd control signals START_EV, START_EVB, START_OD and START_ODB, the falling even and odd control signals START_EV_F, START_EVB_F, START_OD_F and START_ODB_F, and the falling data control signal F_DAT_CTR will be described again with reference to FIG. 5. The falling pipe input unit 411F according to the present embodiment is controlled by these signals. The falling pipe input unit 411F according to the present embodiment may transfer corresponding data among the zeroth to seventh data MXOUT<0:7> to the zeroth to third falling nodes NF0, NF1, NF2, and NF3 in response to one part of address information corresponding to the output order of the zeroth to seventh data MXOUT<0:7>. Since the falling pipe input unit 441F has a structure similar to that of the rising pipe input unit 441R, the detail description thereof is omitted.

The falling pipe output unit 413F synchronizes an output signal of the falling pipe input unit 411F with the first and second falling clock signals FCLKDO1 and FCLKDO2 and outputs the synchronized signal as a falling output signal FDO. The first and second falling clock signals FCLKDO1 and FCLKDO2 will be described again with reference to FIG. 5. The falling pipe output unit 413F controlled by the first and second falling clock signals FCLKDO1 and FCLKDO2 outputs one of data applied to the zeroth to third falling nodes NF0, NF1, NF2 and NF3 in response to remaining part of address information corresponding the output order of the zeroth to seventh data MXOUT<0:7> as the falling output signal FDO.

Figure 5A:
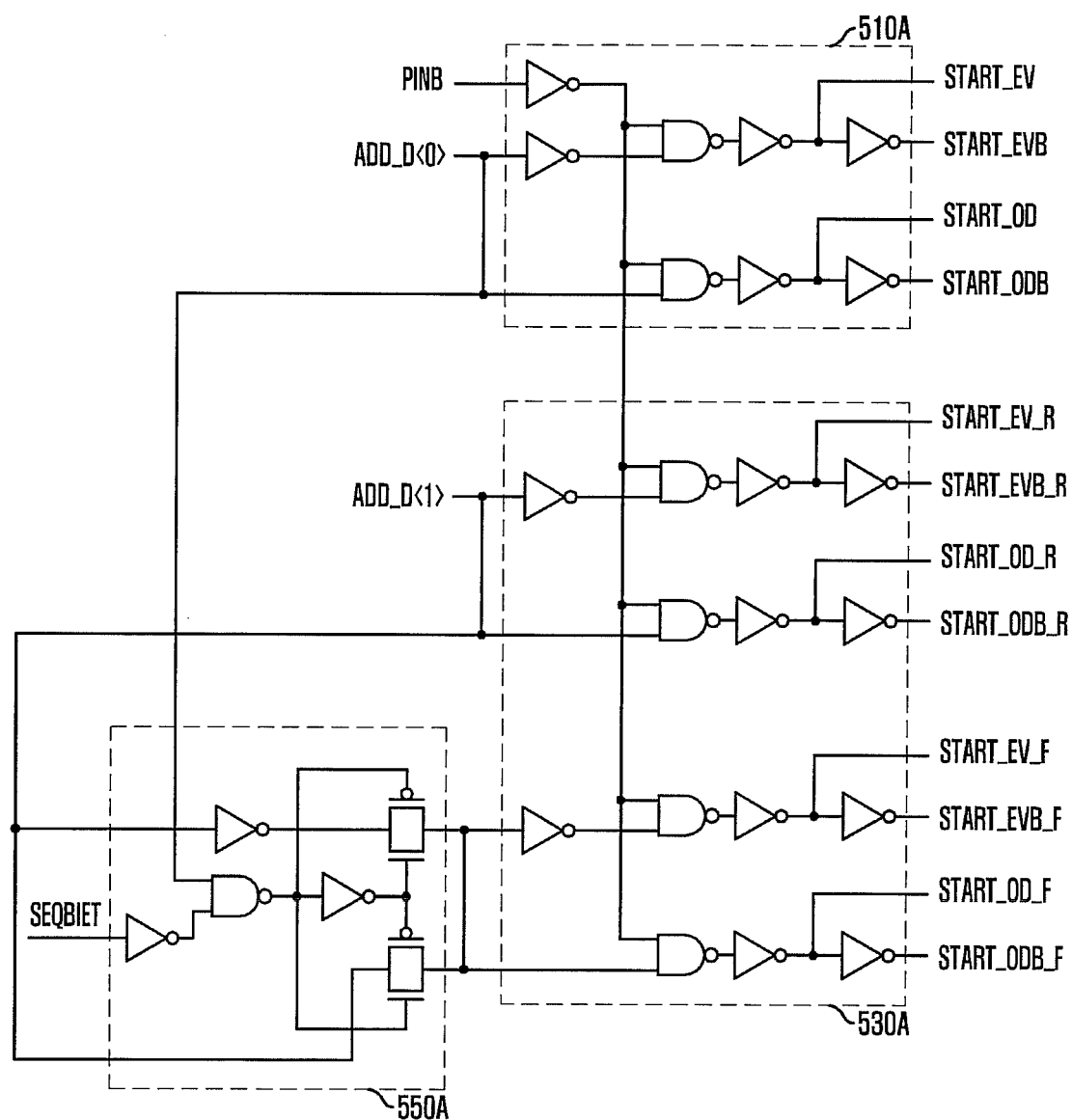
FIGS. 5A to 5C are diagrams illustrating a control signal generator for generating signals that control a rising pipe latch unit 410R and a falling pipe latch unit 410F of FIGS. 4A and 4B.
Figure 5B:
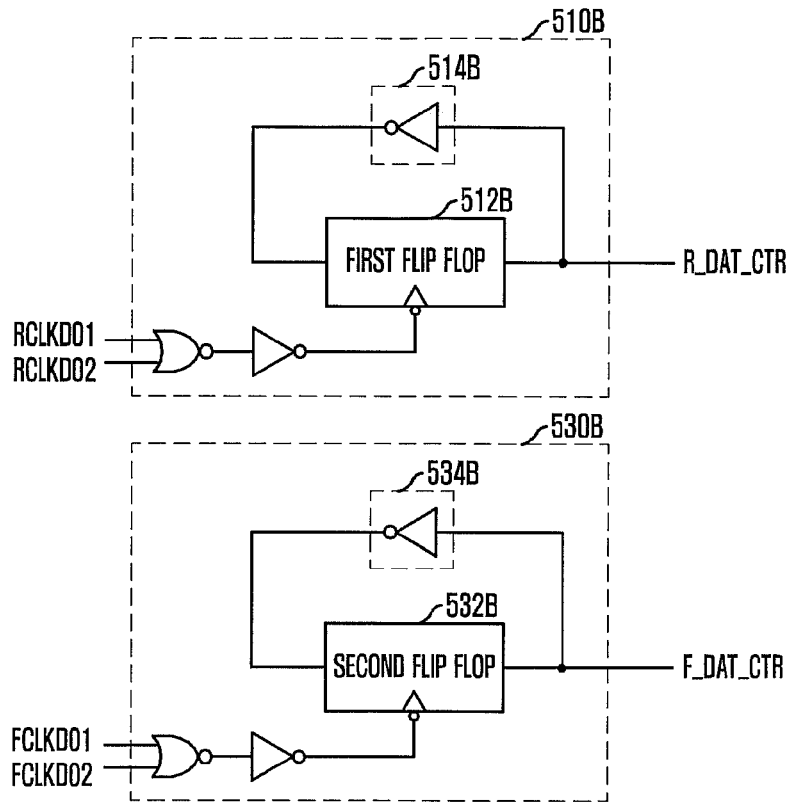
Figure 5C:
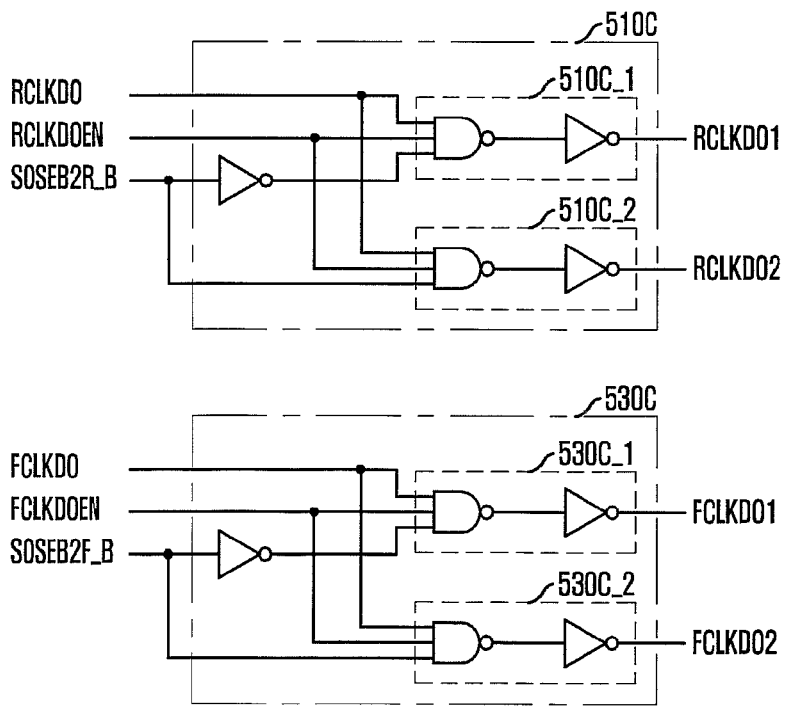

FIGS. 5A to 5C are diagrams illustrating control signal generators for generating control signals that control a rising pipe latch unit 410R and a falling pipe latch unit 410F of FIGS. 4A and 4B.

FIG. 5A illustrates an even and odd control signal generator of the control signal generators.

Referring to FIG. 5A, the odd and even signal generator generates even and odd control signals START_EV, START_EVB, START_OD and START_ODB, rising even control signals START_EV_R and START_EVB_R, rising odd control signals START_OD_R and START_ODB_R, falling even control signals START_EV_F and START_EVB_F, and falling odd control signals START_OD_F and START_ODB_F for partially deciding an order of the zeroth to seventh data MXOUT<0:7>. The odd and even signal generator includes a first control signal generator 510A and a second control signal generator 530A. The odd and even signal generator of FIG. 5A may further include a mode controller 550A for a sequential mode and an interleaving mode of a semiconductor memory device. Hereinafter, the even and odd control signal generator will be described based on the sequential mode, that is, in a state of a logical low mode control signal SEQBINT for better comprehension and easy description.

The first control signal generator 510A generates the even control signals START_EV and START_EVB and the odd control signals START_OD and START_OD in response to a pipe enable signal PINB and a zeroth address signal ADD_D<0>. Here, the zeroth address signal ADD_D<0> is a signal generated by delaying the zeroth address, which is applied in a read command, corresponding to an activation period of the pipe enable signal PINB. Each of the even control signals START_EV and START_EVB and the odd control signals START_OD and START_ODB are delayed using a latch or a flip flop to be operated in a corresponding active period of the rising enable signal RCLKDOEN and the falling enable signal FCLKDOEN shown in a timing diagram of FIG. 6.

The second control signal generator 530A generates rising even and odd control signals START_EV_R, START_EVB_R, START_OD_R and START_ODB_R, and falling even and odd control signals START_EV_F, START_EVB_F, START_OD_F and START_ODB_F in response to the pipe enable signal PINB and the zeroth and first address signals ADD_D<0> and ADD_D<1>. Like the zeroth address signal ADD_D<0>, the first address signal ADD_D<1> is a signal generated by delaying first address, which is applied in the read command, corresponding to an activation period of the pipe enable signal PINB. Each of the rising even and odd control signals START_EV_R, START_EVB_R, START_OD_R and START_ODB_R, and the falling even and odd control signals START_EV_F, START_EVB_F, START_OD_F and START_ODB_F are delayed to be operated in an active period corresponding to the rising enable signal RCLKDOEN and the falling enable signal FCLKDOEN of a timing diagram of FIG. 6.

The mode controller 550A controls the first address signal ADD_D<1> applied to the second control signal generator 530A in response to a mode control signal SEQBINT and the zeroth address signal ADD_D<0>. Particularly, the mode controller 550A transfers the first address signal ADD_D<1> as it is or after inverting to the configuration of the second control signal generator 530A that generates the falling even and odd control signals START_EV_F, START_EVB_F, START_OD_F and START_ODB_F. Also, the mode controller 550A controls a sequential mode or an interleaving mode according to a mode control signal SEQBINT. The sequential mode and the interleaving mode are defined as SPEC.

FIG. 5B illustrates a data control signal generator in a control signal generator.

Referring to FIG. 5B, the data control signal generator includes a first divider 510B for generating a rising data control signal R_DAT_CTR in response to first and second rising clock signals RCLKDO1 and RCLKDO2, and a second divider 530B generates a falling data control signal F_DAT_CTR in response to first and second falling clock signals FCLKDO1 and FCLKDO2.

The first divider 510B includes a first flip flop 512B for controlling a shifting operation of the rising data control signal R_DAT_CTR in response to falling edges of the first and second rising clock signals RCLKDO1 and RCLKDO2, and a first feedback unit 510B for feeding-back the rising data control signal R_DAT_CTR of the first flip flop 512B. The rising data control signal R_DAT_CTR outputted from the first divider 510B is toggled in response to falling edges of the first and second rising clock signals RCLKDO1 and RCLKDO2.

The second divider 530B includes a second flip flop 532B for controlling a shifting operation of the falling data control signal F_DAT_CTR in response to falling edges of the first and second falling clock signals FCLKDO1 and FCLKDO2, and a second feedback unit 534B for feeding back the falling data control signal F_DAT_CTR of the second flip flop 532B. The falling data control signal F_DAT_CTR outputted from the second divider 530B is toggled in response to falling edges of the first and second falling clock signals FCLKDO1 and FCLKDO2.

FIG. 5C illustrates a clock signal controller the control signal generators.

Referring to FIG. 5C, the clock signal controller includes a rising clock signal controller 510C for generating a first and second rising clock signals RCLKDO1 and RCLKDO2 by controlling a rising clock signal RCLKDO and a falling clock signal controller 530C for generating first and second falling clock signals FCLKDO1 and FCLKDO2 by controlling a falling clock signal FCLKDO. The rising clock signal RCLKDO is a signal generated according to rising edges of a DLL clock signal CLK_DLL and a rising activation signal RCLKDOEN shown in FIG. 6. Although it is not shown in FIG. 6, the rising clock signal RCLKDO can be generated by a logical product of the rising activation signal RCLKDOEN and the DLL clocks signal CLK_DLL. Likewise, the falling output signal FCLKDO is a signal generated according to falling edges of the DLL clock signal CLK_DLL and a falling activation signal FCLKDOEN shown in FIG. 6. The falling output signal FCLKDO is not shown in FIG. 6.

The rising clock signal controller 510C generates first and second rising clock signals RCLKDO1 and RCLKDO2, which are control clock signals, in response to the rising clock signal RCLKDO, the rising activation signal RCLKDOEN, and the second rising order selection signal SOSEB2R_B. The rising clock signal controller 510C includes a first clock signal controller 510C_1 and a second clock signal controller 510C_2.

The first clock signal controller 510C_1 generates the first rising clock signal RCLKDO1 by controlling the rising clock signal RCLKDO according to the rising activation signal RCLKDOEN and an inverted signal of the second rising order selection signal SOSEB2R_B. The second clock signal controller 510C_2 generates the second rising clock signal RCLKDO2 by controlling the rising clock signal RCLKDO according to the rising activation signal RCLKDOEN and the second rising order selection signal SOSEB2R_B. That is, the first rising clock signal RCLKDO1 and the second rising clock signal RCLKDO2 may have different activation periods by the second rising order selection signal SOSEB2R_B.

Meanwhile, the falling clock signal controller 530C generates first and second falling clock signals FCLKDO1 and FCLKDO2 in response to a falling clock signal FCLKDO, a falling activation signal RCLKDOEN, and a second falling order selection signal SOSEB2F_B. Since the falling clock signal controller 530C has a similar structure of the rising clock signal controller 510C, detail description thereof is omitted for only easy description.

Hereinafter, the rising and falling activation signals RCLKDOEN and FCLKDOEN and the second rising and falling order selection signals SOSEB2R_B and SOSEB2F_B will be described.

Figure 6:
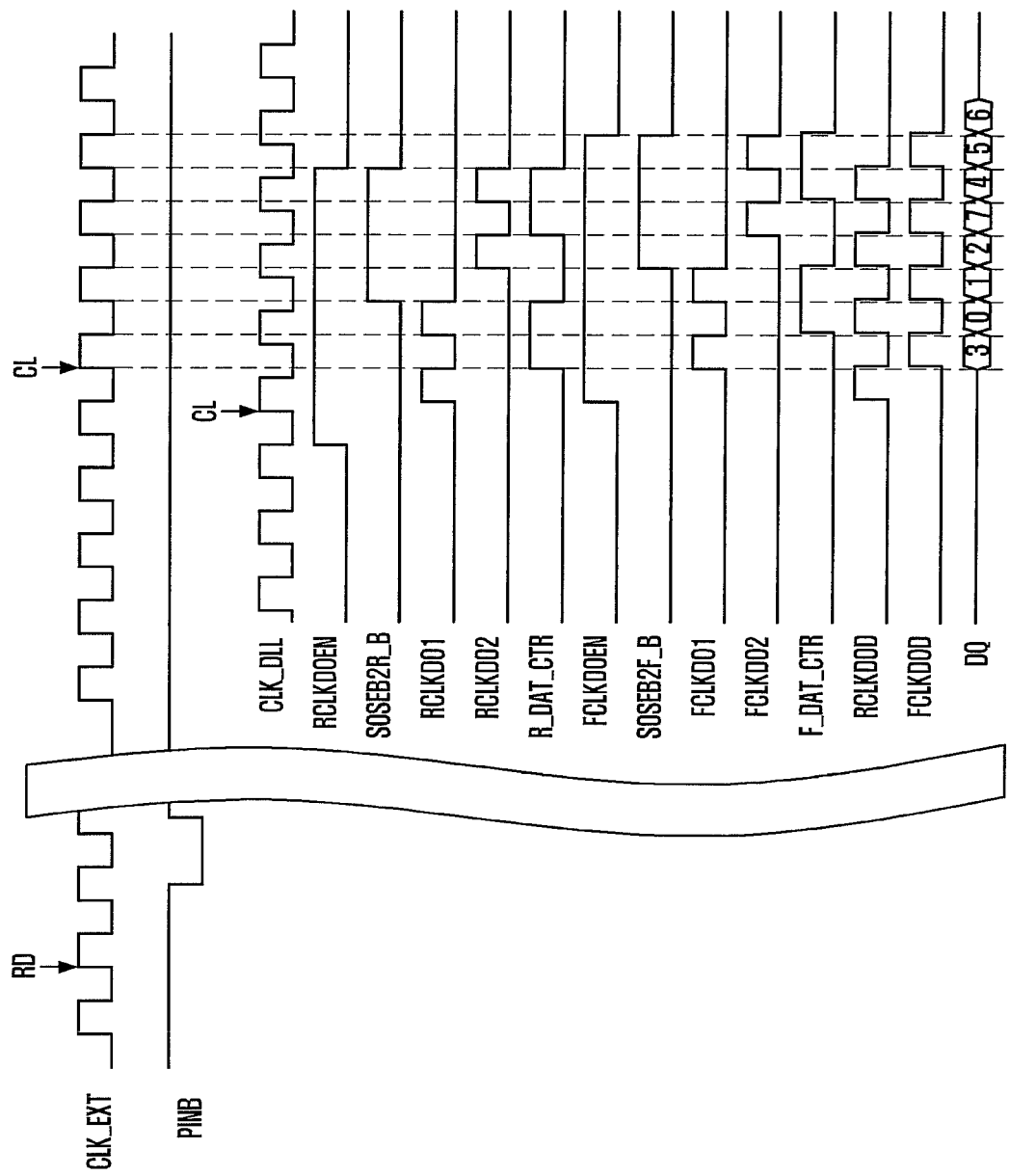
FIG. 6 illustrates waveforms of signals in a read operation, which are shown in FIGS. 4A to 4B and 5A to 5C.

At first, the rising activation signal RCLKDOEN and the falling activation signal FCLKDOEN will be described. Referring to FIG. 6, the rising activation signal RCLKDOEN is a signal for defining an activation period of the first and second rising clock signals RCLKDO1 and RCLKDO2. The falling activation signal FCLKDOWN is a signal for defining an activation period of the first and second falling clock signals FCLKDO1 and FCLKDO2. The rising and falling activation signals are activated to logic 'high' in response to a DLL clock signal corresponding to CAS latency CL.

Figure 1A:
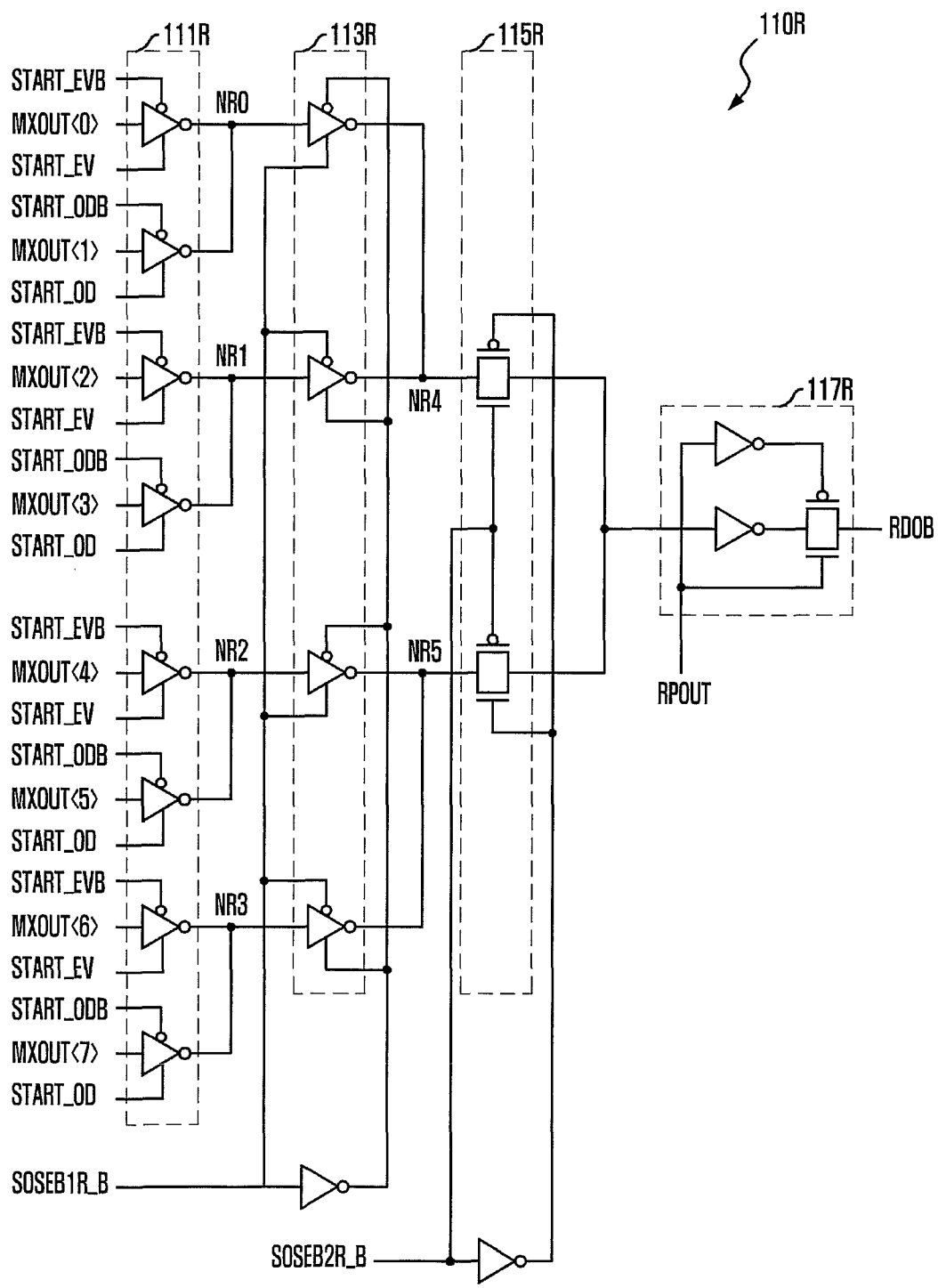
FIGS. 1A and 1B are circuit diagrams illustrating a part of a conventional pipe latch circuit.
Figure 1B:
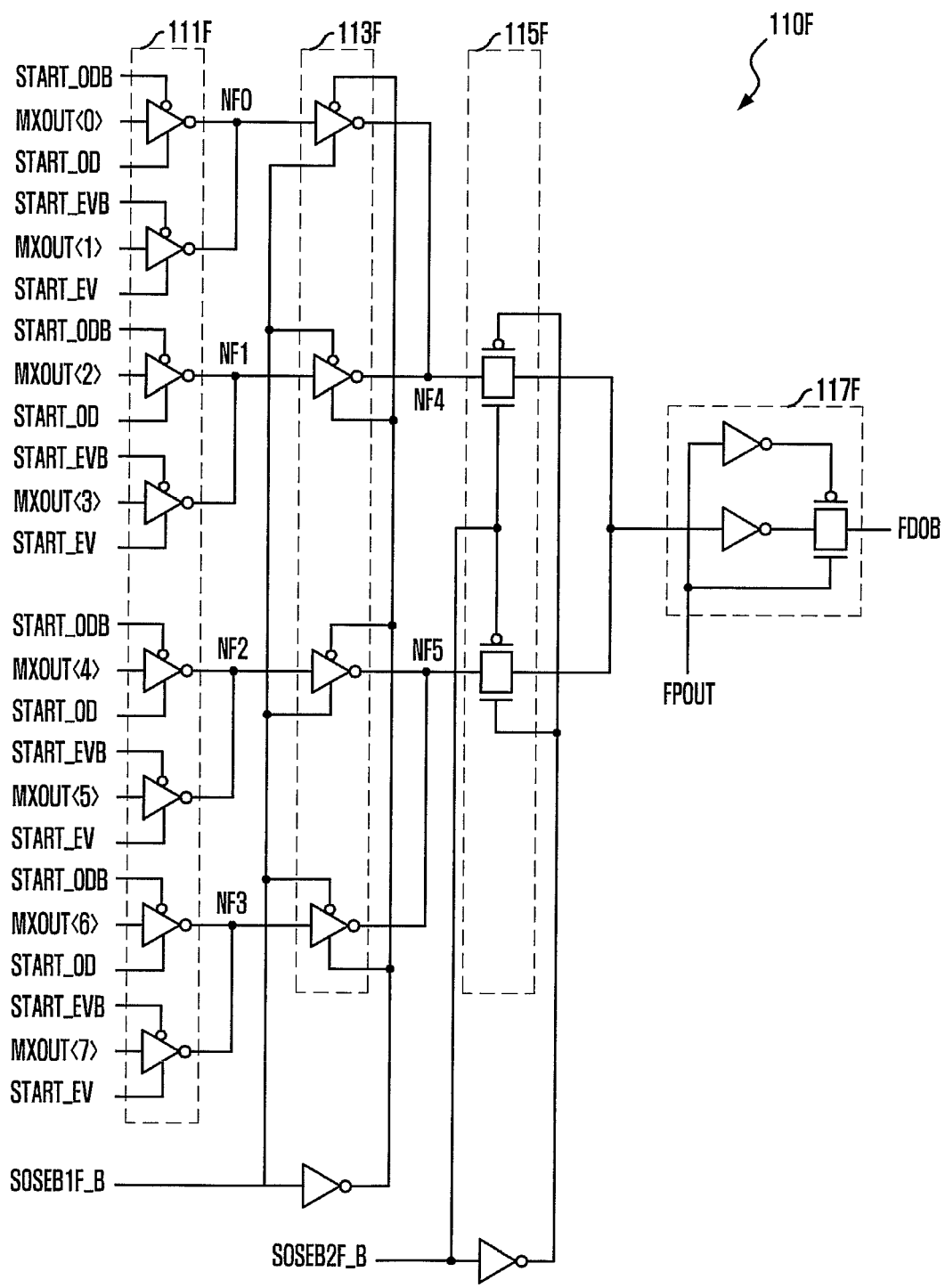
Figure 2:
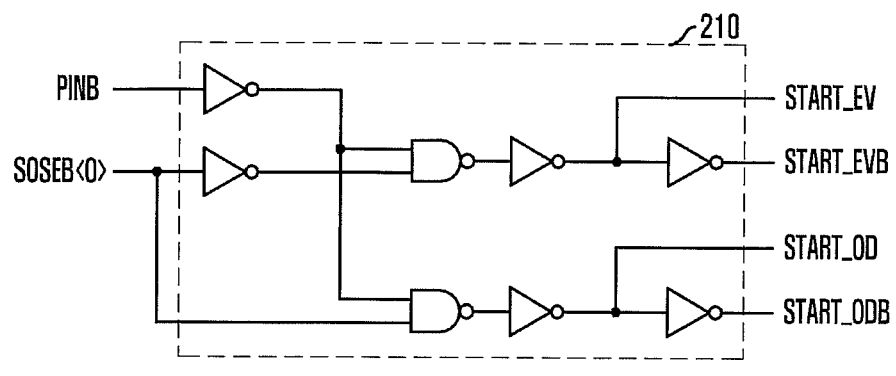
FIG. 2 is a circuit diagram illustrating a control signal generator for generating signals for controlling a rising pipe latch unit 110R and a falling pipe latch unit 110F of FIGS. 1A and 1B.
Figure 2:
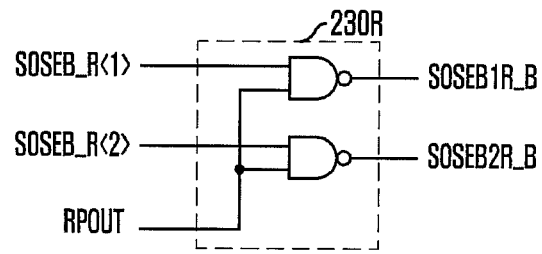
Figure 2:
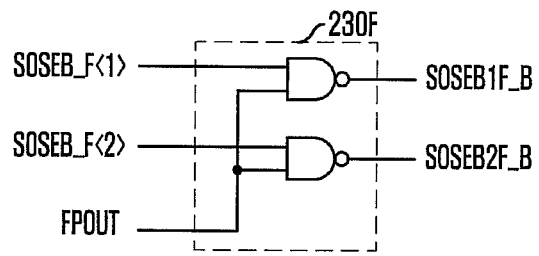
Figure 3:
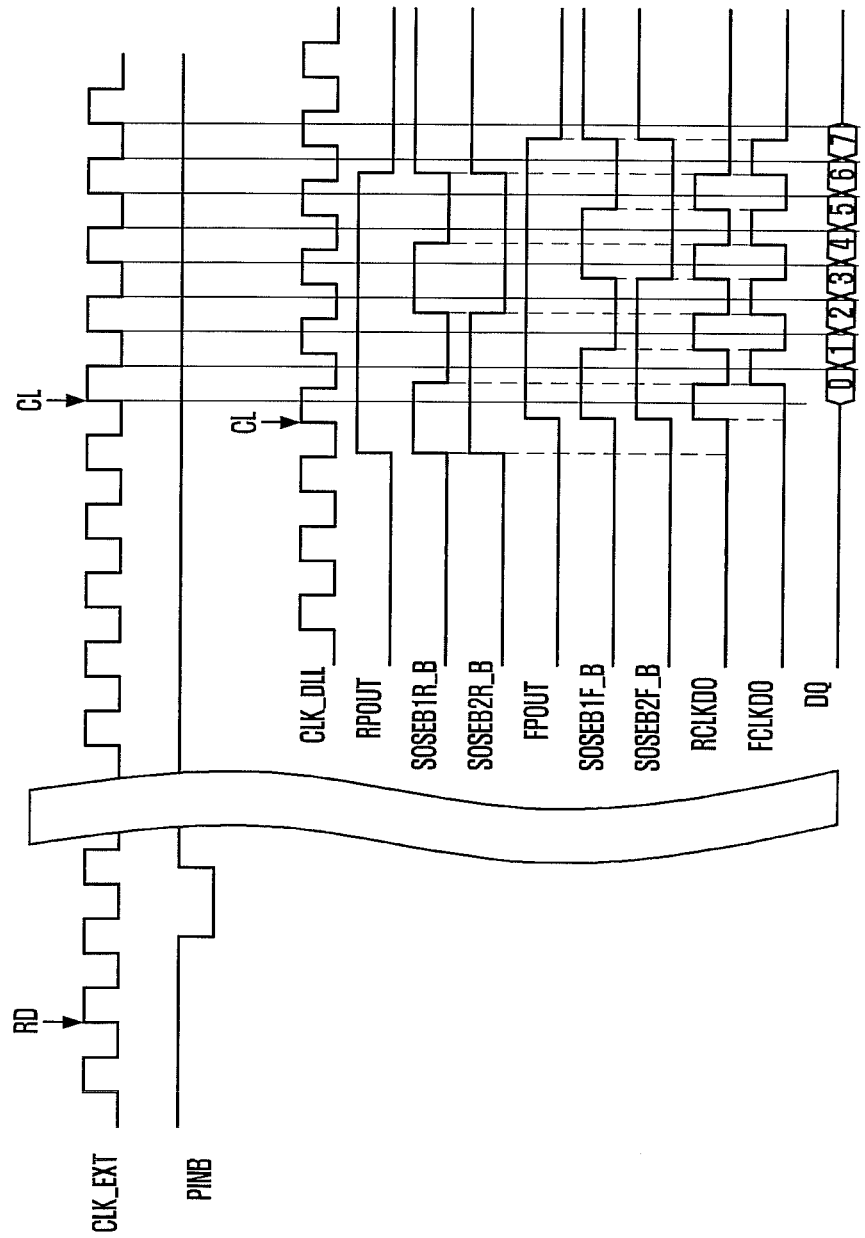
FIG. 3 illustrates waveforms of signals in a read operation, which are shown in FIGS. 1A, 1B and 2.

In more detail, the rising activation signal RCLKDOEN is activated in response to a falling edge of a DLL clock signal CLK_DLL which is ahead of the CAS latency by a half clock. The falling activation signal FCLKDOEN is activated in response to a rising edge of a DLL clock signal CLK_DLL corresponding to CAS latency CL. The rising and falling activation signals RCLKDOEN and FCLKDOEN are inactivated after 4 tCKs in consideration of that a burst length is 8. For example, if the burst length is 4, the rising and falling activation signals RCLKDOEN and FCLKDOEN are activated after 2 tCKs. The rising and falling activation signals RCLKDOEN and FCLKDOEN corresponds to the rising and falling output control signals RPOUT and FPOUT of FIG. 3, respectively.

The second rising order selection signal SOSEB2R_B becomes a signal toggled in a 2tCK-by-2tCK basis corresponding to a second address in an activation period of a rising activation signal RCLKDOEN, and the second falling order selection signal SOSEB2F_B becomes a signal toggled in a 2tCK-by-2tCK basis corresponding to a second address in an activation period of the falling activation signal FCLKDOEN.

FIG. 6 illustrates waveforms of signals in a read operation, which are shown in FIGS. 4A to 4B and 5A to 5C. For illustration purposes, it may be assumed that zeroth to second addresses are applied as '011'. That is, if the zeroth to second addresses are applied as '011', the zeroth and first address signals ADD_D<0> and ADD_D<1> are reflected (or provided) with '1' corresponding to the zeroth and first addresses, and the second rising and falling selection signals SOSEB2R_B and SOSEB2F_F are reflected (provided) with a signal toggled corresponding to the second address as shown in FIG. 6. If the zeroth through second addresses are applied as '011', pre-fetched zeroth to seventh data MXOUT<0:7> are outputted through the input/output pad DQ in an order of the third data XMOUT<3>→the zeroth data XMOUT<0>→the first data XMOUT<1>→the second data XMOUT<2>→the seventh data XMOUT<7>→the fourth data XMOUT<4>→the fifth data XMOUT<5>→the sixth data XMOUT<6>.

After the read command RD, the semiconductor memory device starts outputting data to an input/output pad DQ at a time corresponding to CAS latency CL. The pipe latch circuit according to the present embodiment outputs the zeroth to seventh data MXOUT<0:7> in response to the first and second rising clock signals RCLKDO1 and RCLKDO2 corresponding to a rising edge of a DLL clock signal and in response to the first and second falling clock signals FCLKDO1 and FCLKDO2 corresponding to a falling edge of the DLL clock signal CLK_DLL. An output driver (not shown) outputs the zeroth to seventh data MXOUT<0:7> in response to the rising and falling clock signals RCLKDOD and FCLKDOD, which are generated by delaying rising and falling clock signals RCLKDO and FCLKDO (now shown) to be suitable to a stable operation timing.

Hereinafter, operation of a semiconductor memory device according to the present embodiment will be described with reference to FIGS. 4A, 4B, 5A to 5C and 6.

At first, a pipe enable signal PINB is activated to logic 'low' in response to the read command RD. Here, a first control signal generator 510A of an odd and even control signal generator activates odd control signals START_OD and START_ODB in response to the logic 'high' zeroth address signal ADD_D<0>.

Meanwhile, since a mode control signal SEQBINT becomes logic 'low' in a sequential mode, the second control signal generator 530A activates the rising odd control signals START_OD_R and START_ODB_R and the falling even control signals START_EV_F and START_EVB_F in response to a high 'low' pipe enable signal PINB and a logic 'high' first address signal ADD_D<1>. The rising pipe input unit 411R applies the third data MXOUT<3> among the zeroth to seventh data MXOUT<0:7> to the zeroth rising node NR0, applies the first data MXOUT<1> to the first rising node NR1, applies the seventh data MXOUT<7> to the second rising node NR2, and applies the fifth data MXOUT<5> to the third rising node NR3. The falling pipe input unit 411F applies the zeroth data MXOUT<0> among the plurality of data MXOUT<0:7> to the zeroth falling node NF0, applies the second data MXOUT<2> to the first falling node NF1, applies the fourth data MXOUT<4> to the second falling node NF2, and applies the sixth data MXOUT<6> to the third falling node NF3.

Data applied to the zeroth to third rising nodes NR0, NR1, NR2 and NR3 are outputted to the rising pipe output unit 413R according to a logic level of a rising data control signal R_DAT_CTR outputted from the first divider 510B of the data control signal generator. That is, the rising pipe output unit 413R outputs data applied to the zeroth rising node NR0 and the second rising node NR2 in a logic 'low' period of the rising data control signal R_DAT_CTR, and outputs data applied to the first rising node NR1 and the third rising node NR3 in a logic 'high' period of the rising data control signal R_DAT_CTR.

Then, the rising pipe output unit 413R synchronizes an output signal of the rising pipe input unit 411R in response to the first and second rising clock signals RCLKDO1 and RCLKDO2 outputted from the rising clock signal controller 510C of the clock signal controller and outputs the synchronized signal as a rising output signal RDO. The first and second rising clock signals RCLKDO1 and RCLKDO2 are reflected with a second rising order selection signal SOSEB2R_B for deciding a remaining part of the order of the zeroth to seventh data MXOUT<0:7>. That is, the rising pipe output unit 413R outputs the third data MXOUT<3> applied to the zeroth rising node NR0 in response to the first pulse of the first rising clock signal RCLKDO1, outputs the first data MXOUT<1> applied to the first rising node NR1 in response to the second pulse of the first rising clock signal RCLKDO1, outputs the seventh data MXOUT<7> in response to the first pulse of the second rising clock signal RCLKDO2, and outputs the fifth data MXOUT<5> in response to a second pulse of the second rising clock signal RCIKLDO2. That is, the rising output signal RDO may become the third data MXOUT<3>→the first data MXOUT<1>→the seventh data MXOUT<7>→the fifth data MXOUT<5>. The rising output signal RDO may be synchronized with the rising clock signal RCLKDOD delayed in the output driver and outputted through an input/output pad DQ.

Meanwhile, the falling pipe latch unit 410F performs similar operation of the rising pipe latch unit 410R in response to output signals of the first and second control signal generators 510A and 530A, the second divider 530B and the falling clock signal controller 530C. Then, the falling output signal FDOB becomes the zeroth data MXOUT<0>→the second data MXOUT<2>→the fourth data MXOUT<4>→the eighth data MXOUT<8>. The falling output signal FDO is synchronized with the falling clock signal FCLDKOD delayed in the output driver and outputted through the input/output pad DQ.

In consideration of all of the operating time of the rising pipe latch unit 410R and the falling pipe latch unit 410R, the zeroth to seventh data MXOUT<0:7> are finally outputted in an order of the third MXOUT<3>→the zeroth data MXOUT<0>→the first data MXOUT<1>→the second data MXOUT<2>→the seventh data MXOUT<7>→the fourth data MXOUT<4>→the fifth data MXOUT<5>→the sixth data MXOUT<6>.

The pipe latch circuit according to the present embodiment uses only the first and second rising clock signals RCLKDO1 and RCLKDO2 and the first and second falling clock signals FCLKDO1 and FCLKDO2, which are synchronized with the DLL clock signal CLK_DLL, for generating the rising output signal RDO and the falling output signal FDO. Since the first and second rising clock signals RCLKDO1 and RCLKDO2 and the first and second falling clock signals FCLKDO1 and FCLKDO2 are used in the rising and falling pipe output units 413R and 413F performing symmetric operation, the pipe latch circuit according to the present embodiment may use one control signal synchronized with the DLL clock signal CLK_DLL for outputting the rising and falling output signals RDO and FDO. That is, in order to control the conventional pipe latch circuit, three signals synchronized with the DLL clock signal are required, for example, one for the first rising and falling selection output units 113R and 113F, one for the second rising and falling selection output units 115R and 115F, and one for rising and falling output units 117R and 117F. Since the present embodiment can minimize the necessary signals for controlling the pip latch circuit, the skew problem of the pipe latch circuit according to the related art can be prevented. Also, it is possible to easily secure a margin between data outputted from the pipe latch circuit and a control signal controlling an output driver.

While the present invention has been described with respect to the specific embodiments, it will be apparent to those skilled in the art that various changes and modifications may be made without departing from the spirit and scope of the invention as defined in the following claims.

Furthermore, the logic gates and the transistors in the embodiments may be modified according to a polarity of an input signal.

Embodiments of the present invention relate to for serializing a plurality of data in a predetermined order and outputting the serialized data, and a driving method thereof. The pipe latch circuit according to the present invention can widen a valid data window of data outputted from the pipe latch circuit by minimizing a skew of the pipe latch circuit.

Also, the pipe latch circuit according to the present invention can prevent a semiconductor memory device from generating error by improving a margin of data outputted from the pipe latch circuit and a control signal controlling an output driver.

What is claimed is:

1. A pipe latch circuit comprising:
    a pipe input unit configured to sequentially receive a plurality of data in response to address information and first and second control signals;
    a control signal generator configured to generate the first and second control signals based on the address information and a synchronization clock signal, wherein the first and second control signals correspond to a rising or falling edge of the synchronization clock signal; and
    a pipe output unit configured to synchronize an output signal of the pipe input unit in response to first and second clock signals and output the synchronized output signal,
    wherein the control signal generator is configured to activate the first and second clock signals in response to a clock activation signal and the clock activation signal is activated in response to CAS latency information and deactivated based on burst length information.

2. The pipe latch circuit of claim 1, wherein the control signal generator is configured to generate the first and second clock signals having different activation periods from each other in response to the clock activation signal and the address information.

3. The pipe latch circuit of claim 1, wherein the pipe output unit includes:
    a first synchronizer for outputting the output signal of the pipe input unit in synchronization with the first clock signal; and
    a second synchronizer for outputting the output signal of the pipe input unit in synchronization with the second clock signal.

4. The pipe latch circuit of claim 3, further comprising:
    a latch unit for latching output signals of the first and second synchronizers and outputting the latched output signals.

5. The pipe latch circuit of claim 1, wherein the control signal generator includes:
    a first control signal generator for generating the first control signal in response to the address information; and
    a second control signal generator for generating the second control signal in response to the first and second clock signals.

6. The pipe latch circuit of claim 5, wherein the second control signal generator includes:
    a divider for controlling a shifting operation for the second control signal in response to one of the first and second clock signals; and
    a feedback unit for feeding back the second control signal to the divider.

7. The pipe latch circuit of claim 5, wherein the control signal generator further includes:
    a mode controller for controlling a transfer of the address information to the first control signal generator in response to a mode control signal that indicates a sequential mode or an interleaving mode.

8. The pipe latch circuit of claim 5, wherein the pipe input unit includes:
    a path selector for selecting different output paths for transferring different data of the plurality of data, respectively, in response to the first control signal; and
    a selection output unit for selecting a corresponding output signal among output signals of the path selector in response to the second control signal and outputting the selected output signal.

9. A pipe latch circuit comprising:
    a first pipe input unit configured to, in response to a first control signal and a second control signal that correspond to a first edge of the synchronization clock signal, sequentially receive a plurality of data in an order corresponding to address information;
    a second pipe input unit configured to, in response to another first control signal and another second control signal that correspond to a second edge of the synchronization clock signal, sequentially receive the plurality of data in an order corresponding to the address information;
    a control signal generator configured to generate the first control signals and second control signals by using the address information;
    a first pipe output unit configured to output an output signal of the first pipe input unit in synchronization with a first clock signal; and
    a second pipe output unit configured to output an output signal of the second pipe input unit in synchronization with a second clock signal,
    wherein the control signal generator is configured to activate the first and second control signals in response to first and second clock activation signals and the first and second clock activation signals are each activated in response to CAS latency information and deactivated based on burst length information.

10. The pipe latch circuit of claim 9, wherein the first clock activation signal is activated corresponding to the first edge and the second clock activation signal is activated corresponding to the second edge.

11. The pipe latch circuit of claim 9, wherein the control signal generator includes:
a first clock signal controller for generating the first control signals in response to the first clock activation signal and the address information; and
a second clock signal controller for generating the second control signals in response to the second clock activation signal and the address information.

12. The pipe latch circuit of claim 9, wherein the plurality of first and second control signals are activated in different periods according to the address information.

13. The pipe latch circuit of claim 9, wherein the first and second pipe output units each include a plurality of synchronizers for synchronizing an output signal of a corresponding pipe input unit with a corresponding one of the first and second clock signals.

14. The pipe latch circuit of claim 13, wherein the first and second pipe output units each further include a latch unit for latching output signals of the plurality of synchronizers and outputting latched output signals.

15. The pipe latch circuit of claim 9, wherein the control signal generator includes:
a first control signal generator for generating the first control signal in response to the address information; and
a second control signal generator for generating the second control signal in response to the first and second clock signals.

16. The pipe latch circuit of claim 15, wherein the first and second control signal generators include:
a plurality of dividers for each controlling a shifting operation for a respective one the second control signals in response to the first and second clock signals; and
a plurality of feedback units for feeding back the second control signals to the respective ones of the plurality of dividers.

17. The pipe latch circuit of claim 15, wherein the control signal generator including the first and second control signal generator further includes a mode controller for controlling a transfer of the address information to the first control signal generator in response to a mode control signal that indicates a sequential mode or an interleaving mode.

18. The pipe latch circuit of claim 15, wherein each of the first and second pipe input units includes:
a path selector for selecting different output paths for transferring different data of plurality of data, respectively, in response to the first control signal; and
a selection output unit for selecting a corresponding output signal among output signals of the path selector in response to the second control signal and outputting the selected output signal.

19. A method of driving a pipe latch circuit, the method comprising:
receiving a plurality of data in an order corresponding to address information;
generating a plurality of control signals by using the address information, wherein the control signals correspond to a rising or falling edge of a synchronization clock signal; and
outputting the plurality of data sequentially in response to a plurality of clock signals,
wherein the plurality of clock signals are activated in response to a plurality of clock activation signals and the plurality of clock activation signals are each activated in response to CAS latency information and deactivated based on burst length information.

20. The method of claim 19, wherein in generating the plurality of clock signals, the plurality of clock signals having different activation periods from each other are generated in response to a corresponding clock activation signal and the address information.

21. The method of claim 19, further comprising latching the sequentially outputted data.

22. The method of claim 19, wherein generating the plurality of control signals includes:
generating a first control signal in response to the address information; and
generating a second control signal in response to the first and second clock signals.

23. The method of claim 22, wherein generating the second control signal includes:
controlling a shifting operation for the second control signal in response to the plurality of clock signals; and
feeding back the second control signal for performing the shift operation.

24. The method of claim 22, wherein generating the plurality of control signals further includes controlling a transfer of the address information in response to a mode control signal that indicates a sequential mode or an interleaving mode.

25. The method of claim 22, wherein receiving the plurality of data includes:
selecting different output paths for transferring different data of the plurality of data in response to the first control signal; and
selecting a corresponding output signal obtained through one of the output paths in response to the second control signal.

* * * * *